United States Patent

Shimizu et al.

[11] Patent Number: 4,887,886
[45] Date of Patent: Dec. 19, 1989

[54] COLORED ARTICLES WITH INTERFERENCE LAYERS MADE OF A COMPOSITE OF SILICON DIOXIDE AND SILICON CARBIDE

[75] Inventors: Toshio Shimizu; Kouji Hirose, both of Tokyo, Japan

[73] Assignee: Seikosha Co., Ltd., Tokyo, Japan

[21] Appl. No.: 91,280

[22] Filed: Aug. 31, 1987

[30] Foreign Application Priority Data

Sep. 2, 1986 [JP] Japan ................................ 61-206527

[51] Int. Cl.$^4$ ........................... G02B 1/10; G02B 5/28; B32B 9/00
[52] U.S. Cl. .................................. 350/166; 428/333; 428/704
[58] Field of Search ................ 350/166; 428/333, 704

[56] References Cited

U.S. PATENT DOCUMENTS

| | | | |
|---|---|---|---|
| 2,394,533 | 2/1946 | Colbert et al. | 350/166 |
| 2,758,510 | 8/1956 | Auwärter | 350/166 |
| 4,187,336 | 2/1980 | Gordon | 350/166 X |
| 4,308,316 | 12/1981 | Gordon | 350/166 X |
| 4,609,267 | 9/1986 | Deguchi et al. | 350/166 X |

Primary Examiner—Bruce Y. Arnold
Assistant Examiner—David J. Edmondson
Attorney, Agent, or Firm—Bruce L. Adams; Van C. Wilks

[57] ABSTRACT

A colored article comprises a workpiece having a surface producing a color by light interference. The surface is defined by forming a reflective surface and coating the reflective surface with a composite layer of SiC and $SiO_2$ having an $SiO_2$ ingredient ratio of 5 to 80% by weight and a thickness of 200 to 3000 Å or with a composite layer of $Si_3N_4$ and $SiO_2$ having an $SiO_2$ ingredient ratio of 5 to 80% by weight and a thickness of 400 to 4000 Å.

14 Claims, 2 Drawing Sheets

COLORED ARTICLES WITH INTERFERENCE LAYERS MADE OF A COMPOSITE OF SILICON DIOXIDE AND SILICON CARBIDE

BACKGROUND OF THE INVENTION

1. Industrial Field of the Invention

This invention concerns a colored article that can be applied to exterior parts, spectacle frames, stationeries, personal ornaments, accessories, etc. and, more specifically, it relates to a colored article exhibiting various tones by the interference of light.

2. Prior Art

Heretofore, no intentional control and use have been made to the exterior tones in the manner of applying the light interference in watches, miscellaneous goods, electrical products, etc. That is, tones such as red, orange, yellow, green, blue, purple blue and purple for exterior use have been obtained as the object color of pigmented resins or the like, or by applying painting or plating to the material such as of metal or resin.

3. Problems to be Solved by the Invention

Accordingly, colors obtained by the known prior art are, so to speak, those of the materials per se and lack in the clearness of transparent feeling. In addition, in the case of painting or plating, there has been a problem of close bondability for painted films or plated layers to the material, which may cause drawbacks of peeling and abrasion.

SUMMARY OF THE INVENTION

An object of the present invention is to provide a colored article exhibiting bright tones of transparent feeling by the interference of light which has not been known in the art.

Another object of this invention is to obtain an aimed clear tone of transparent feeling with good reproducibility by the interference of light.

A further object of the present invention is to provide a colored article excellent in abrasion resistance and corrosion resistance.

BRIEF DESCRIPTION OF THE DRAWINGS

The drawings are concerned with the present invention, wherein.

DETAILED DESCRIPTION OF THE INVENTION

Figure 1:
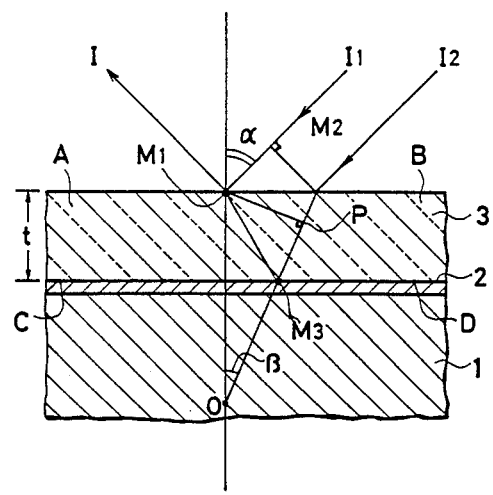
FIG. 1 is an explanatory view for the principle of the present invention.

The feature of the preset invention lies in expressing the tone by applying the interfering nature of light. In FIG. 1, a reflection surface 2 having a predetermined reflectance is formed on a member 1 as a primer material (article). The member 1 is made of plastic, metal, ceramic, etc. with no particular restriction, in which mirror-like gringing treatment is applied in the case of metal and primer treatment with high reflectance such as plating is applied in the case of plastic or ceramic. A light permeable coating layer 3 comprising a nitride, oxide, carbide, etc. of at least one element belonging to the groups IIIb, IVa, IVb, Va and VIa of the periodical table is formed alone or in a composite state on the reflection surface 2, and the coating layer 3 has such a thickness as capable of exhibiting an aimed tone by the interference of light.

Suitable examples are, for example, AlN or $Al_2O_3$ for the compound of the group IIIb element, $TiO_2$, $ZrO_2$, TiC, ZrC or HfC for the compound of the group IVa element, $SiO_2$, SiO, SiC or $Si_3N_4$ for the compound of the group IVb element, VO, $Ta_2O_5$, VC, NbC or TaC for the compound of the group Va element and $Cr_2O_3$, $MoO_3$, $Cr_3C_2$, $Mo_2C$ or WC for the compound of the group VIa element, respectively.

Function

In FIG. 1, assuming incident lights to the light permeable coating layer 3 of a thickness t as $I_1$, $I_2$, reflection light as I, angle of incident as $\alpha$, refractivity as $\mu$ and angle of reflection as $\beta$, the interference between the reflection light $I_1$. $M_1$, I at the surface AB and the reflection light $I_2$. $M_2$, $M_3$, $M_1$, I from the rear face CD can be represented as: $PM_3 + M_1M_3 = PO = M_1O \cos \beta = 2t \cos \beta$, which is converted into the optical path length in air by multiplying the refractivity $\mu$ into $2ut \times \cos \beta$. Since the interference of lights occurs such that they offset with each other to get dark when the difference between the optical paths is an odd number multiple of the half wavelength, while strengthen each other to get bright when it is an even number of multiple, considering the phase deviation of $\frac{1}{2}$ wavelength upon reflection on the CD surface and assuming n as a positive integer and $\lambda$ as the wavelength, the bright condition is expressed as: $2n \times \lambda/2 = \mu t \cos \beta + \lambda/2$, i.e., $t\mu \cos \beta = \lambda/4 (2n-1)$, while the dark condition is expressed as $(2n+1) \lambda/2 = 2\mu t \cos \beta + \lambda/2$, i.e., $t\mu \cos \beta = \lambda/4 (2n)$. If the thickness t of the coating layer 3 and the refractivity $\mu$ are known, the color-emitting wavelength due to the interference of visible rays is determined. Further, it is also possible to determine the thickness t of the coating layer 3 in accordance with the wavelength of a required color. Further, if the angle of incidence changes, the tone is varied in a delicate manner depending on the direction of view. Furthermore, since the parallelism of the light permeable coating layer surfaces, spectral reflectance proeperty inherent to the layer substance, the purity of the layer substance, difference in the absorption level, birefringence in which light is separated into two lights with deviated optical oscillation faces depending on the direction of crystallization in the substance, refraction phenomenon, etc. are acted actually to each other, simple explanation may be impossible only by the principle of the interference, but an interference light forecastable mainly by the interference action can be obtained.

Based on the principle as described above according to the present invention, a desired interference color can be produced by selectively interfering lights having desired color-emitting wavelength among the incident light (natural light or white light).

Further, the method of selecting the interference color, that is, the method of selecting the interference wavelength can be attained by controlling the thickness of the light permeable thin film as described above, as well as by constituting a light permeable thin film with a multi-layered film, each layer comprising a different substance and selecting the substance forming each of the layers, setting the order of the layering and controlling the thickness for each of the layers.

Effect of the Invention

Since the present invention has the constitution as described above, an interference color can be selected by controlling the film thickness and the material for the light permeable coating layer thereby obtaining a clear tone of transparent feeling such as red, orange, yellow, green, blue, purple blue and purple by way of interference and providing exterior casings or accessories of high quality feeling.

The light permeable coating layer is composed of a nitride, oxide or carbide of at least one element in the groups IIIb, IVa, IVb, Va and VIa and, accordingly, it is of high hardness and excellent in abrasion resistance, as well as also excellent in corrosion resistance due to its chemical stability. Particularly, if the material of the member is made of plastic, which is soft and liable to be injured, it can be provided with excellent abrasion resistance since the light permeable coating layer also functions as a protection film by the constitution according to the present invention.

Example

EXAMPLE 1

After applying a mirror finish to the surface by way of grinding, plating or the like to the surface in the case of metal, or after applying primer treatment with high reflectance such as plating to the surface in the case of resin or ceramic, a light permeable coating layer comprising SiC as the main ingredient and containing $SiO_2$ within a range from 5 to 80% by weight in the ingredient ratio in a composite manner was coated on the surface. The composite coating layer was a transparent film of brown-red color, and only the lights of specific wavelength region are caused to interfere by utiliziing the interfering property of light.

Explanations will be made more specifically regarding this.

EXAMPLE 1—1

After placing a flat plate part made of polycarbonate (PC) resin in a sputtering device and reducing the pressure to a vacuum of about $(1.0-2.0) \times 10^{-3}$ Pa, Ar gas was injected to a pressure of $6.0 \times 10^{-1}$ Pa, and metal Cr (for primer treatment) and a composite material containing SiC as the main ingredient and $SiO_2$ by 20% was used as a target. In the processing step, primary treatment was at first applied by sputtering the Cr metal at a high frequency output of 8 Watt/cm$^2$ for 2 min and, thereafter, $SiC-SiO_2$ composite material was sputtered at a high frequency output of 8 Watt/cm$^2$ for 8 min. As a result, it was possible to coat Cr as the primer treatment layer to a thickness of 500 Å and the light permeable coating layer of $SiC-SiO_2$ to a thickness of 1400 Å on the PC flat plate part, and red interference color was obtained over the entire area of the coating surface.

EXAMPLE 1-2

In the same manner as above, Cr (primer treatment layer) was coated to a constant thickness of 500 Å, while the coating thickness of the light permeable coating layer of $SiC-SiO_2$ was changed by varying the sputtering time. Then, interference colors were obtained over the entire area of the coating surface, that is, blue interference color at 600 Å, yellow interference color at 1200 Å, purple blue interference color at 1700 Å and green interference color at 1900Å of $SiC-SiO_2$ respectively. When the thickness of the light permeable coating layer was further increased, red interference color was obtained at 2300 Å, but no interference was exhibited if the layer thickness was increased further.

As has been described above, light in a specified wavelength region can be selected depending on the layer thickness of $SiC-SiO_2$, that is, the interference color can be selected. In this case, the layer thickness and the selectivity to the wavelength region were varied with the ingredient ratio of $SiO_2$ in the material containing SiC as the main ingredient, showing the tendency that the change of the wavelength region, that is, the change in the interference color to the layer thickness was moderated along with the increase in the $SiO_2$ content and the brightness of the interference light was lowered.

In view of the relationship to the brightness, the upper limit of $SiO_2$ was 80% and the maximum layer thickness showing the interference color, which was blue, was 3000 Å.

EXAMPLE 1-3

In the case when the light permeable coating layer was composed only of SiC, the change of the wavelength region relative to the layer thickness became sharp, which was unfavorble since it was difficult to obtain an identical interference color over the entire area of the coating surface in relation with the distribution of the layer thickness upon film formation and there was a problem of reproducibility as well. Then, it was preferable that $SiO_2$ is contained at least by more than 5%. In this case, a clear blue interference color was exhibited from the layer thickness of 200 Å and the interference color was changed as in the same manner as described above along with the increase in the layer thickness. Particularly, clear interference color was obtained by the composite layer in the interference color of red on the side of the longer wavelength and blue purple on the side of the shorter wavelength.

Although the light permeable coating layer was formed by the sputtering in the above-mentioned example, it is also possible to adopt vacuum vapor deposition or ion plating in place of the sputtering.

In the case of employing an EB (electron beam) method regrding the evaporation source both in the vacuum deposition and ion plating, a mirror-finished flat metal plate was placed in a device, $SiC-Si_2$ material composite in an adequate ingredient ratio was placed in a crucible and vapor deposition or ion plating was applied under appropriate evaporating conditions to form a layer on the flat metal plate.

In the case of resin material, electron guns and crucibles were disposed each by two in one device, metal material such as Cr was placed in one of the crucibles while $SiC-SiO_2$ material composite in an adequated ingredient ratio was placed in the other of the crucibles, the metal material was at first evaporated by an electron gun to form a primary treating layer on the flat resin plate and, thereafter $SiC-SiO_2$ material was evaporated to form a light permeable coating layer.

In this example, clear tone such as of red, orange, yellow, green, blue, purple blue or purple could be obtained, and the color was varied as well depending on the angle of view since it was an interference color thereby obtaining a color of an extremely high decorative nature.

Further, the selectivity of the wavelength region of the reflection light relative to the layer thickness was moderated by the addition of $SiO_2$ to SiC thereby enabling one to obtain a color of high reproducibility. Further, since the transparency of the light permeable coating layer was increased by the addition of $SiO_2$, the interference tone became more clear with higher transparent feeling.

In addition, since $SiO_2$ was added to SiC, the problem of close bondability and impact shock resistance, i.e., the inherent drawback to SiC could be improved and an ornamental layer can be obtained, which had from 1500 to 2400 Hv of micro Vickers hardness although somewhat inferior in the hardness as compared with the case of using SiC alone, was sufficiently hard as the ornamental layer, excellent in abrasion resistance and also excellent in corrosion resistance because of its carbide and oxide composite constitution.

EXAMPLE 2

After applying a mirror finish by grinding, plating or the like to the surface in the case of metal, or after applying primer treatment of high reflectance by plating or the like in the case of resin or ceramic, a light permeable coating layer comprising $S_3N_4$ as the main ingredient and $SiO_2$ within a range from 5% to 80% in the ingredient ratio composite was coated. While the composite layer itself was a transparent brown layer, the transparent layer could cause interference of light to obtain a specific tone.

Explanations will be made in the case of using sputtering.

EXAMPLE 2-1

After placing a flat plate part made of PC resin in a sputtering device and reducing the pressure to a vacuum of about $(1.0-2.0) \times 10^{-3}$ Pa, Ar gas was injected to a pressure of $6.0 \times 10^{-1}$ Pa, and metal Cr (for primer treatment) and a composite material containing $Si_3N_4$ as the main ingredient and $SiO_2$ by 20% was used as a target.

Primary treatment was at first applied by sputtering Cr metal at a high frequency output of 8 Watt/cm$^2$ for 2 min and, thereafter, $Si_2N_4$-$SiO_2$ composite material was sputtered at a high frequency output of 8 Watt/cm$^2$ for 8 min. As a result, it was possible to coat Cr as the primer treatment layer to a thickness of 500 Å and the light permeable coating layer of $Si_3N_4$-$SiO_2$ to a thickness of 700 Å on the PC flat plate part and a blue interference color was obtained over the entire area of the coating surface.

EXAMPLE 2—2

In the same manner as above, the coating of the Cr primer treatment layer was made to a constant thickness of 500 Å, while the coating thickness of the light permeable coating layer of $Si_3N_4$-$SiO_2$ was changed by varying the sputtering time. Then, interference colors were obtained over the entire area of the coating surface, that is, yellow interference color at 1400 Å, red interference color at 1800 Å, blue purple interference color at 2000 Å and green interference color at 2300 Å of $Si_3N_4$-$SiO_2$, respectively. When the thickness of the light permeable coating tayer was further increased, an orange interference color was obtained at 2800 Å, but no interference was exhibited if the layer thickness was increased further.

As has been described above, various interference colors could be obtained depending on the layer thickness of $Si_2N_4$-$SiO_2$. In this case, the layer thickness and the selectivity to the wavelength region were varied with the ingredient ratio of $SiO_2$ in the material containing $Si_3N_4$ as the main ingredient, showing the tendency that the change of the wavelength region, that is, the change in the interference color to the layer thickness was moderated along with the increase in the $SiO_2$ content and that the brightness of the interference light was lowered. In view of the relationship to the brightness, the upper limit of $SiO_2$ was 80% and the maximum layer thickness showing the interference color, which was blue, was 4000 Å.

EXAMPLE 2-3

When the light permeable coating layer was formed only with $Si_3N_4$, the change of the wavelength region relative to the layer thickness became sharp, which was unfavorable since it was difficult to obtain an identical interference color over the entire area of the coating surface in relation with the distribution of the layer thickness upon layer formation and there was a problem of reproducibility as well. Then, it was preferable that $SiO_2$ was contained at least by more than 5%. In this case, a clear blue interference color was exhibited at the layer thickness greater than 400 Å and the interference color was changed in the same manner as described above along with the increase in the layer thickness.

Clear interference colors were obtained by the composite layer of $Si_3N_4$-$SiO_2$ in the interference color of yellow and blue colors in the intermediate wavelength region.

Although the explanations have been made for the sputtering as an example in the above-mentioned examples, it is also possible to adopt vacuum vapor deposition or ion plating with similar effects.

In the case of employing the EB method regarding the evaporation source both in the vacuum deposition and ion plating, a mirror finished flat metal plate was placed in a device, $Si_3N_4$-$Si_2$ material composite in an adequate ingredient ratio was placed in a crucible and vapor deposition and ion plating were conducted under appropriate evaporating conditions to form layers on the flat metal plate.

In the case of resin material, electron guns and crucibles were disposed each by two in one device, metal material such as Cr for primer treatment layer was placed in one crucible while $Si_3N_4$-$SiO_2$ material composite in an adequated ingredient ratio was placed in the other crucible, the metal material was at first evaporated by an electron gun to form a primary treating layer on the flat resin plate and, thereafter, $Si_3N_4$-$SiO_2$ material was evaporated to form a light permeable coating layer.

EXAMPLE 3

In this example, multiple interference colors could be obtained simultaneously by considering or controlling the configuration of the light permeable coating layer producing the interference color as described above.

Figure 2:
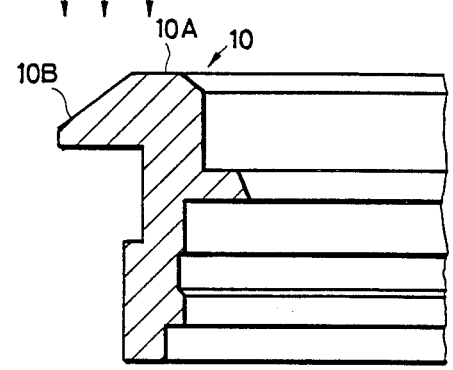
FIG. 2 is a cross sectional view for a portion of a watch exterior case applied with the present invention.

The surface configuration of a watch case frame 10 shown in FIG. 2 was designed such that a step was formed to provide a slight difference in parallel distances as viewed from the direction of the arrows, and a mixture of a SiC-SiO$_2$ system was sputtered from the direction of the arrows at a sputtering rate of 170 Å/min for about 12 min to form a light permeable coating layer.

This produced a difference in the layer thickness between the portion 10A nearer to the sputtering gate and the portion 10B somewhat remote therefrom and, as a result, clear interference colors were shown, i.e., green color at the portion 10A and from pink to red purple colors at the portion 10B.

It is of course possible for a three, four or more color consititution utilizing the slight difference in the distribution of the layer thickness depending on the locations by making the configuration more complicated.

In this way, according to Example 3, it is possible to consititute a plurality of tones in one step and a plurality of geometrical tones can be arranged by applying a thee dimensional design to the surface or the cross sectional configuration.

EXAMPLE 4

Figure 3:
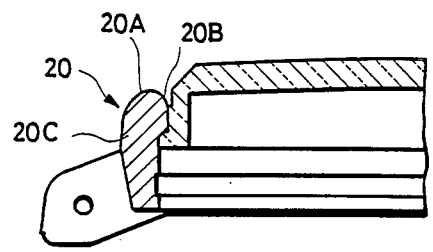
FIG. 3 is a cross sectional view for a portion of another embodiment of a watch exterior case applied with the present invention.

When sputtering was applied under the same conditions as in Example 3 for about 10 min to a curved portion of a watch case frame 20 shown in FIG. 3, interference colors were produced, i.e., a blue purple color at the central portion 20A and a yellow color at the portions 20B and 20C on both sides, to produce a clear tone in which the blue color was sandwiched by the yellow color in an coaxial manner. In the case of the configuration of this watch case, the tone was varied continuously.

EXAMPLE 5

Figure 4A:
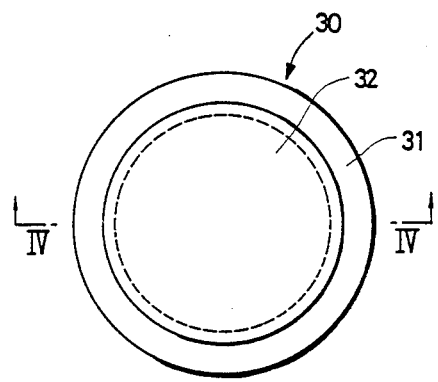
FIG. 4A is a plan view for a still further embodiment of a watch exterior case applied with the present invention.
Figure 4B:
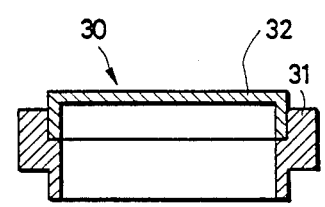
FIG. 4B is a cross sectional view taken along line IV—IV in FIG. 4A, and FIGS. 4C and 4D are, respectively, enlarged cross sectional views for the portions of the watch exterior case.

In this example, a light permeable coating layer was formed on a watch case 30 comprising an exterior case 31 and a transparent cover 32 such as a front glass as shown in FIGS. 4A and 4B.

Figure 4C:
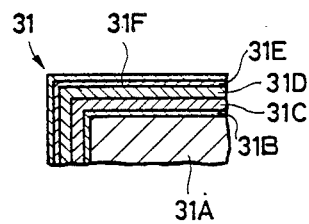
Figure 4D:
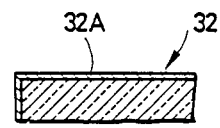

Plating was applied at first to a member 31A made of ABS resin as the exterior casing 31. Specifically, as shown in FIG. 4C, after applying electroless Ni plating 31B to a thickness of 0.05 μm, plating was conducted successively, i.e., electrolytic Cu plating 31C of 10 μm, electrolytic Ni plating 31D of 10 μm and electrolytic Cr plating 31E of 0.25 μm. After the completion of the plating, the transparent cover 32 made of acrylic resin was bonded to the exterior case 31. After the bonding, the watch case 30 was placed in a sputtering device and, after reducing the pressure to a vacuum of about $(1.0-2.0) \times 10^{-3}$ Pa, Ar gas was injected to a pressure of $6.0 \times 10^{-1}$ Pa, and composed of a composite material of Si$_3$N$_4$-SiO$_2$, nitride and oxide of group IVb Si was used as a target. The SiO$_2$ ingredient ratio was set to 20%. Sputtering was applied to the composite material target at a high frequency output of 8 Watt/cm$^2$ for 7 min. As a result, a transparent coating layer 31F composed of SI$_3$N$_4$-SiO$_2$ could be coated to a thickness of 0.14 μm on the surface of the extrior case 31. A clear yellow interference color of transparent feeling was produced on the exterior case 31 made of ABS resin formed with the primer plating. While on the other hand, as shown in FIG. 4D, Si$_3$N$_4$-SiO$_2$ layer 32A was formed on the transparent cover 32 to a thickness of 0.14 μm, which showed a semi-transparent pale brown color inherent to the layer.

In this way, a clear yellow intrference color of transparent feeling and a semi-transparent pale brown color were well matched with each other and an exterior case of high quality feeling could be obtained by one step of sputtering treatment.

Thus, in the case of using the watch case 30, a semi-transparent pale brown color could be obtained for the transparent case 32 on a dial plate to form a so-called smoked state, which was well matched with the yellow interference color of the exterior case 31 thereby obtaining a watch exterior case of high quality feeling.

EXAMPLE 5-2

When sputtering was applied in the same manner as above for a target of Si$_3$N$_4$-SiO$_2$ composite material at a high frequency output of 8 watt/cm$^2$ for 3.5 min, the light permeable coating layer of Si$_3$N$_4$-SiO$_2$ could be coated to a thickness of 0.07 μm. The exterior case 31 exhibited a clear blue interference color of transparent feeling, whereas the cover 32 exhibited a semi-transparent pale brown color inherent to the layer. In this way, it was possible to vary the interference color of the exterior case 31 even for an identical material by varying the layer thickness.

EXAMPLE 5-3

When sputtering was applied quite in the same manner as above by using composite SiC-SiO$_2$ material composed of the carbide and oxide of group IVb Si at a high frequency output of 8 Watt/cm$^2$ for 8 min, light permeable coating layer of SiC-SiO$_2$ could be coated to a thicknes of 0.14 μm, by which the exterior case 31 exhibited a clear red interference color of transparent feeling, whereas the exterior case 32 exhibited a semi-transparent pale red brown color inherent to the layer.

EXAMPLE 5-4

Similar effects could also be confirmed for the target for AlN-Al$_2$O$_3$ composite material of nitride and oxide of group IIIb Al, carbide and oxide of TiC-TiO$_2$ of the group IVa Ti, composite TaC-WO$_3$ composed of carbide of group Ta and oxide of group VIa W, as well as AlN or BN of group IIIb Al or B alone, carbide and nitride of SiC, Si$_3$N$_4$ of group IVb Si alone and carbide TiC of group IVa Ti alone as the target respectively. The exterior case 31 exhibited interference color depending on the material and the layer thickness respectively, while the transparent cover 32 exhibited a semi-transparent color inherent to the layer depending on the material.

In the Examples 5-1-5-4, interference color and semi-transparent color inherent to the layer of the material were obtained together, for example, in a watch case. Referring to the interference color, clear tone of transparent feeling such as of red, orange, yellow, green, blue, purple blue and purple could be obtained by changing the color by varying the material and the layer thickness of the light permeable coating layer. The interference color was well matched with the transparent color thereby enabling to obtain an exterior case of high quality feeling. Further, the light permeable coating layers 31F, 32A were generally hard, excellent in the abrasion resistance, as well as excellent in corrosion resistance due to their chemical stability. Particularly, in the case of plastic, since the light permeable coating layer functions also as a protection layer, those excellent in the abrasion resistance have been obtained.

In a case where the member 31A of the exterior casing 31 is made of metal material, the light permeable coating layer can be formed without applying plating to the surface of the material.

It will be apparent that the present invention is not restricted only to parts and can be applied also to ornaments or personal ornaments such as accessories.

What is claimed is:

1. A colored article in which a light permeable coating layer having a nitride, oxide or carbide of at least one of the elements belonging to the groups IIIb, IVa, IVb, Va and VIa of the periodic table alone or in a composite state is formed on a reflection surface of a predetermined reflectance formed on a member, and wherein the coating layer comprises SiC and SiO$_2$ in a composite state of a thickness of 200 to 3000 Å, and the SiO$_2$ ingredient ratio is 5 to 80% by weight to provide a color by light interference.

2. A colored article as defined in claim 1, wherein the coating film is formed by vapor deposition, sputtering or ion plating.

3. A colored article as defined in claim 1, wherein the reflection surface comprises a plurality of surfaces, each differing from each other in a distance from or in an angle relative to a frontmost surface of the member.

4. A colored article as defined in claim 1, wherein the material of the member is non-metal material such as synthetic resin or ceramic and the reflection surface is formed on the surface of said material by way of primer treatment such as plating.

5. A colored article as defined in claim 4, wherein the reflection surface is formed as a curved surface.

6. A colored article as defined in claim 1, wherein the material for the member is metal material and the reflection surface is formed on the surface of the material by way of surface treatment such as grinding or plating.

7. A colored article as defined in claim 6, wherein the reflection surface is formed as a curved surface.

8. A colored article as defined in claim 1, wherein the reflection surface is formed as a curved surface.

9. A colored article comprising a transparent member and a member formed with a reflection surface of a predetermined reflectance connected to the transparent member, in which a light permeable coating layer comprising a nitride, oxide or carbide of at least one of the elements belonging to the groups IIIb, IVa, IVb, Va and VIa of the periodic table alone or in a composite state is formed on said transparent member and said reflection surface, and wherein the coating layer comprises SiC and SiO$_2$ in a composite state of a thickness of 200 to 3000 Å, and the SiO' ingredient ratio is 5 to 80% by weight to produce a color by light interference.

10. A colored article comprising: a workpiece having a surface exhibiting a color by light interference, the surface defined by forming a reflective surface; and coating the reflective surface with a composite layer of SiC and SiO$_2$ having an SiO$_2$ ingredient ratio of 5 to 80% by weight and a thickness of 200 to 3000 Å.

11. The article according to claim 10, wherein the article further comprises a transparent surface having said composite layer coated thereon.

12. The article according to claim 10, wherein the composite layer is coated by vapor deposition, sputtering or ion plating.

13. The article according to claim 10, wherein the reflective surface is formed by applying a primer treatment or a surface treatment.

14. The article according to claim 10, wherein the reflective surface is curved.

* * * * *